US006760222B1

(12) United States Patent
Wang

(10) Patent No.: US 6,760,222 B1
(45) Date of Patent: Jul. 6, 2004

(54) DISSIPATING HEAT USING A HEAT CONDUIT

(75) Inventor: David G. Wang, San Diego, CA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 10/153,331

(22) Filed: May 21, 2002

(51) Int. Cl.[7] .................................................. H05K 7/20
(52) U.S. Cl. ................ 361/700; 165/104.33; 174/15.2; 361/694; 361/695
(58) Field of Search .............................. 165/80.2, 80.4, 165/104.26, 104.33, 104.34; 361/687, 694–695, 698–699, 700–703; 174/15.1–15.2; 257/714–716

(56) References Cited

U.S. PATENT DOCUMENTS

| | | | |
|---|---|---|---|
| 5,768,483 A | | 6/1998 | Maniwa et al. |
| 6,105,662 A | * | 8/2000 | Suzuki .................. 165/104.33 |
| 6,152,369 A | | 11/2000 | Wilz, Sr. et al. |
| 6,437,983 B1 | * | 8/2002 | Machiroutu et al. ........ 361/700 |
| 6,549,408 B2 | * | 4/2003 | Berchowitz ................. 361/700 |
| 6,587,735 B1 | | 7/2003 | Yaguchi |

OTHER PUBLICATIONS

US 2003/0128515 "Chassis–Level Thermal Interface Component For Transfer Of Heat From An Electronic Component Of A Component System", Faneuf et al, Jul. 10, 2003.*
Thermacore International, Inc., Heat Pipe Technology, How it Works, 1 page (dated at least as early as Nov. 15, 2001).
Thermacore International, Inc., Heat Pipe Technology, Frequently Asked Questions about Heat Pipes, pp. 1–4 (dated at least as early as Nov. 15, 2001).

* cited by examiner

Primary Examiner—Gregory D. Thompson
(74) Attorney, Agent, or Firm—Trop, Pruner & Hu, P. C.; John D. Cowart

(57) ABSTRACT

A heat dissipation apparatus has an elongated heat conduit (such as a heat pipe) in thermal communication with a heat spreader for thermally contacting a heat-generating device. The heat spreader has a phase-change mechanism to spread heat within the heat spreader. In one implementation, the phase-change mechanism includes paths for heated vapor flow and cooled liquid flow.

21 Claims, 4 Drawing Sheets

DISSIPATING HEAT USING A HEAT CONDUIT

BACKGROUND

Electronic devices, such as microprocessors, microcontrollers, input/output devices, and memory devices, have become increasingly powerful. For optimal performance, such devices operate at high clock speeds. Increased operating speeds lead to increased power usage by devices which in turn means that a greater amount of heat is generated by such devices during operation. A heat dissipation mechanism is typically used to prevent excessive heat buildup in the devices, which may damage the devices or reduce their reliability. Operational integrity can also be adversely affected when a device is overheated.

Computing and other electronic systems, including portable systems such as laptop or notebook computers or personal digital assistants, have continued to decrease in size. The relatively small size of such systems places a limit on the size and weight of heat dissipation components, such as heat sinks. Typically, components that have high power usage require larger heat-sinks for effective cooling in systems that employ forced air-cooling technology. However, system size limitations prevent use of large heat sinks.

Also, large heat sinks tend to be relatively heavy. When mounted directly on components, heavy heat sinks can cause reliability problems. For example, certain types of integrated circuit (IC) packages are easily damaged by the pressure and torque applied by a heavy heat sink both during static operating conditions and during transit conditions (e.g., during shipping), where shock and vibration may be induced. Further, a heavy heat sink can damage the connection between a component and a board on which the component is mounted. Various constraints thus serve to limit the size of heat dissipation components and potentially the effectiveness of such heat dissipation components.

In some systems, remote cooling is performed in which heat pipes are used to transfer heat from an IC device to a heat sink that is remotely located from the IC device. In such an arrangement, the heat sink is not directly mounted on the IC device, which allows flexibility in the size and shape of the heat sink.

Traditionally, the thermal connection between a heat pipe and an IC device surface is made by employing a thermally conductive metal block or heat spreader between the heat sink and the IC device. A heat pipe generally has an effective (or apparent) thermal conductivity that is several orders of magnitude greater than the thermal conductivity of most metallic heat spreaders. As a result, the use of a heat spreader in such an arrangement adds thermal resistance in the thermal path (due to the limited thermal conductivity of a conventional heat spreader or compared to the effective thermal conductivity of a heat pipe), which reduces the effectiveness of remote cooling of the IC device.

SUMMARY

In general, a mechanism is provided to enhance heat dissipation in a system. For example, a system includes a device that generates heat during operation, with the device having a surface. The system further includes a heat spreader that is thermally contacted to the surface, with the heat spreader adapted to dissipate heat using a phase-change mechanism. A heat conduit is in thermal communication with the heat spreader to transfer heat from the heat spreader to another location in the system.

Other or alternative features will become apparent from the following description, from the drawings, and from the claims.

DETAILED DESCRIPTION

In the following description, numerous details are set forth to provide an understanding of the present invention. However, it is to be understood by those skilled in the art that the present invention may be practiced without these details and that numerous variations or modifications from the described embodiments may be possible.

In accordance with some embodiments, a heat-dissipating apparatus includes one or more elongated heat conduits that are used to transfer heat from one or more heat-generating components to a remotely located heat sink. The heat sink is located in an airflow path generated by an airflow generator. In one implementation, the elongated heat conduit includes a heat pipe. The heat conduits are able to traverse tight areas and over distance within a system so that heat from the heat-generating components can be more effectively communicated to a region of relatively high airflow. To enhance heat dissipation, the heat-dissipating apparatus uses an improved heat spreader between the elongated heat conduit and the heat-generating component, with the improved heat spreader having an effective thermal conductivity that is substantially higher than that offered by typical solid metallic heat spreaders (such as those made with copper). By using the improved heat spreader, thermal resistance between the heat-generating component and the elongated heat conduit is reduced to provide more effective heat dissipation. In one embodiment, the improved heat spreader is a vapor chamber such as one manufactured by Thermacore Inc.

Figure 1:
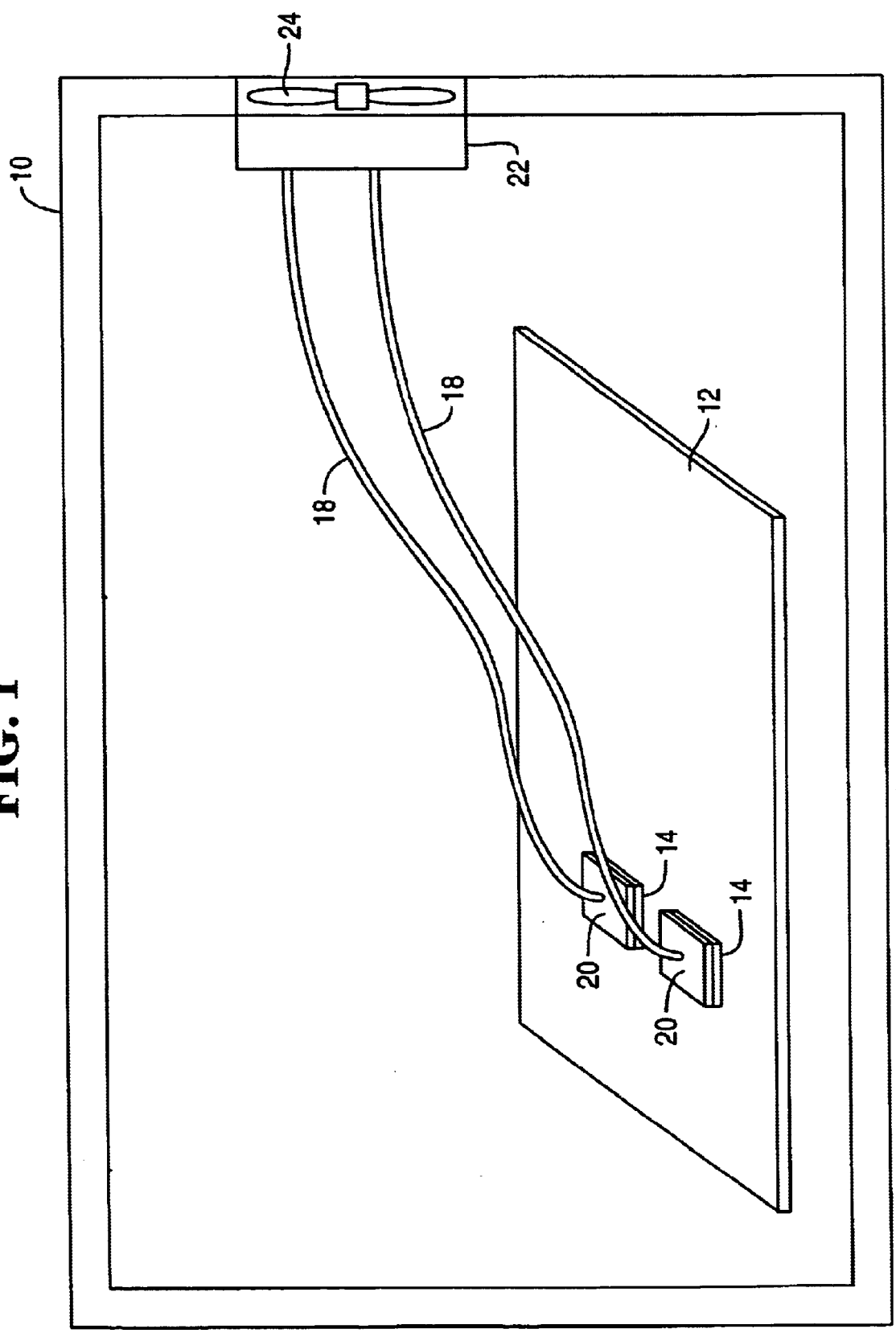
FIG. 1 illustrates a portion of a system having electronic devices thermally coupled to a heat dissipating apparatus in accordance with an embodiment

FIG. 1 shows an example arrangement of components in a system 10. The components include a main board 12 with a plurality of devices 14 mounted on the main board 12. In one example, the devices 14 include integrated circuit (IC) devices. In other embodiments, the devices 14 are other types of components that generate heat during operation. Examples of devices 14 include processors, memory devices, input/output (I/O) or peripheral devices, system controllers, power supplies, and other components. On an actual main board 12, there typically is a denser arrangement of devices 14 than shown in the example of FIG. 1.

As further shown in FIG. 1, a heat-dissipating apparatus includes plural elongated heat conduits 18 that are in thermal contact with respective heat spreaders 20 mounted on respective devices 14. Although FIG. 1 shows a one-to-one correspondence between heat spreaders 20 and devices 14, other arrangements can have multiple heat spreaders 20 contacted to one device, or vice versa, one heat spreader 20 contacted to multiple devices, 14.

Generally, a "heat conduit" is any conduit having relatively high effective thermal conductivity that is able to transfer or carry heat from one point to another point in a system with minimal temperature drop or thermal resistance. An "elongated" heat conduit is generally long and narrow, and has a length along which heat transfer occurs. Thus, heat is transferred from one portion of the elongated heat conduit along its length to another portion of the elongated heat conduit (such as from one end to another end). In one example, the elongated heat conduit is a heat pipe. Some heat pipes have effective thermal conductivities several orders of magnitude higher than thermal conductivities of heat conductive solid metals such as copper.

A heat pipe is generally tubular in structure with a longitudinal bore through which vapor is able to flow. The heat pipe also includes a wick structure along the inner wall of the tubular structure in which liquid is able to travel. Combined, the movement of heated vapor and cooled liquid within the tubular structure of the heat pipe effectively transfers heat from one point to another. Such a cooling mechanism is an example of a phase-change cooling mechanism, in which a liquid at a first location is heated to a vapor state, with the vapor transported to another location for cooling back to liquid state. The cooled liquid is transported back to the first location. In one configuration, the cross-sectional profile of the heat pipe is generally circular. In other configurations, heat pipes can have other cross-sectional profiles.

As used here, "thermal communication" or "thermal contact" refers to any coupling between one component and another that enables relatively efficient transfer of heat between the components. The components can be thermally contacted with each other by external force such as a fastening device, or by thermally conductive adhesive materials such as thermally conductive epoxy.

The heat conduits 18 are connected to a heat sink 22, which is placed in the airflow path of an airflow generator 24, such as a fan. In other embodiments, the heat conduits 18 can be connected to more than one heat sink, and there can be more than one fan in the system.

The benefit of using the heat conduits 18 is that they are able to traverse tight spaces and over a relatively long distance in various parts of the system 10 where there are high concentrations of components. The heat conduits 18 transfer heat from the heat-generating components, including devices 14, to the heat sink (or heat sinks) 22. The heat sink 22 spreads the heat that is communicated to it by the heat conduits 18. Air flow generated by the airflow generator 24 passing through the heat sink 22 dissipates heat from the heat sink 22.

In accordance with some embodiments of the invention, one or more of the heat spreaders 20 are designed to have an effective thermal conductivity that is similar to or the same as the thermal conductivity of the heat conduits 18. For example, the heat spreader 20 has an effective thermal conductivity that is on the same order of magnitude as the heat conduit 18 to which the heat spreader 20 is connected. As noted above, if the heat conduits 18 are heat pipes, then use of a conventional solid metallic (such as a copper block) heat spreader 20, contacted to each device 14, will introduce thermal resistance in the path from the heat source (e.g., device 14) to the heat conduit 18.

Figure 2:
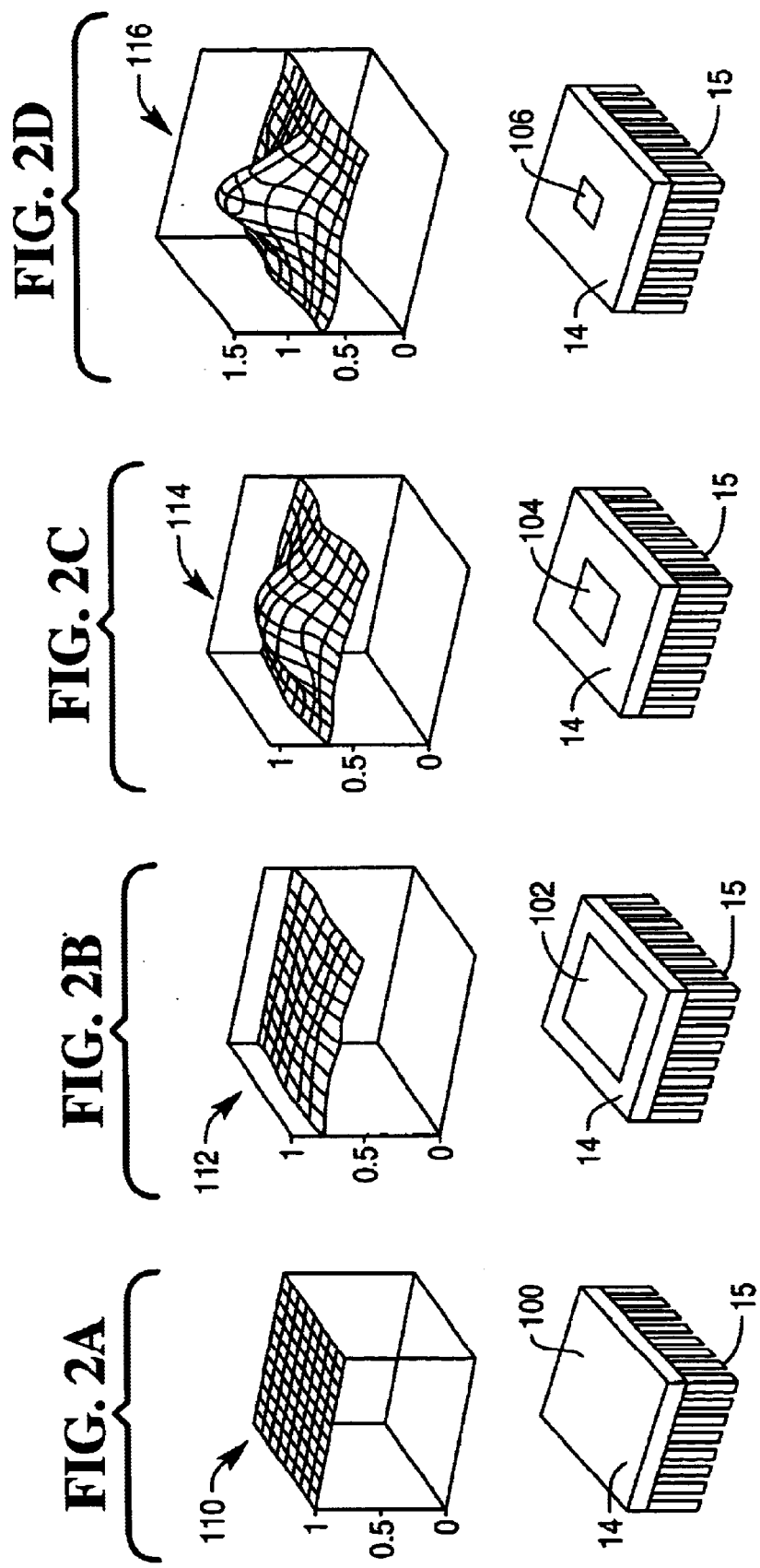
FIGS. 2A–2D illustrate distribution of heat over a surface of a heat-generating device.

A further drawback of using conventional heat spreaders (formed of metallic materials in the form of a solid block) is that hot spots may be present on a surface of a device due to power concentration on the device surface which is smaller than the area of the heat spreader. This is illustrated in FIGS. 2A–2D. FIG. 2A shows a device 14 (attached to a conventional heat sink 15) with a relatively uniform distribution of heat over the surface 100 of the device 14. The distribution of heat is illustrated by the temperature distribution graph 110 in FIG. 2A. FIG. 2B shows the device having a region 102 of elevated temperature within the outer boundaries of the device 14. As shown by graph 112, the region 102 has a higher temperature than the boundary region outside the region 102. FIG. 2C shows a more concentrated hot spot where the boundary 104 of the hot spot is smaller, which results in a more localized heat concentration. The smaller hot spot 104 means that the peak temperature in the hot spot 104 is higher than the peak temperature of the region 102 in FIG. 2B, as shown by graph 114. The hot spot shown in FIG. 2D is concentrated in an even smaller area 106 than the area 104 of FIG. 2C, and is associated with an even higher peak temperature as shown by graph 116.

Traditional solid metallic heat spreaders are usually not efficient in spreading heat from concentrated hot spots, such as those shown in FIGS. 2C and 2D. As a result, damage may occur to the components due to inefficient heat spreader design.

To improve on the thermal conductivity of the heat spreader 20 in accordance with some embodiments of the invention, a heat spreader 20 includes a vapor chamber that is based on heat pipe technology. More generally, the heat spreader 20 uses a phase-charge mechanism for transferring heat. A phase-change mechanism involves changing the phase of a cooling medium (e.g., between liquid and vapor phases) to aid in communicating heat from one surface to another.

Figure 3:
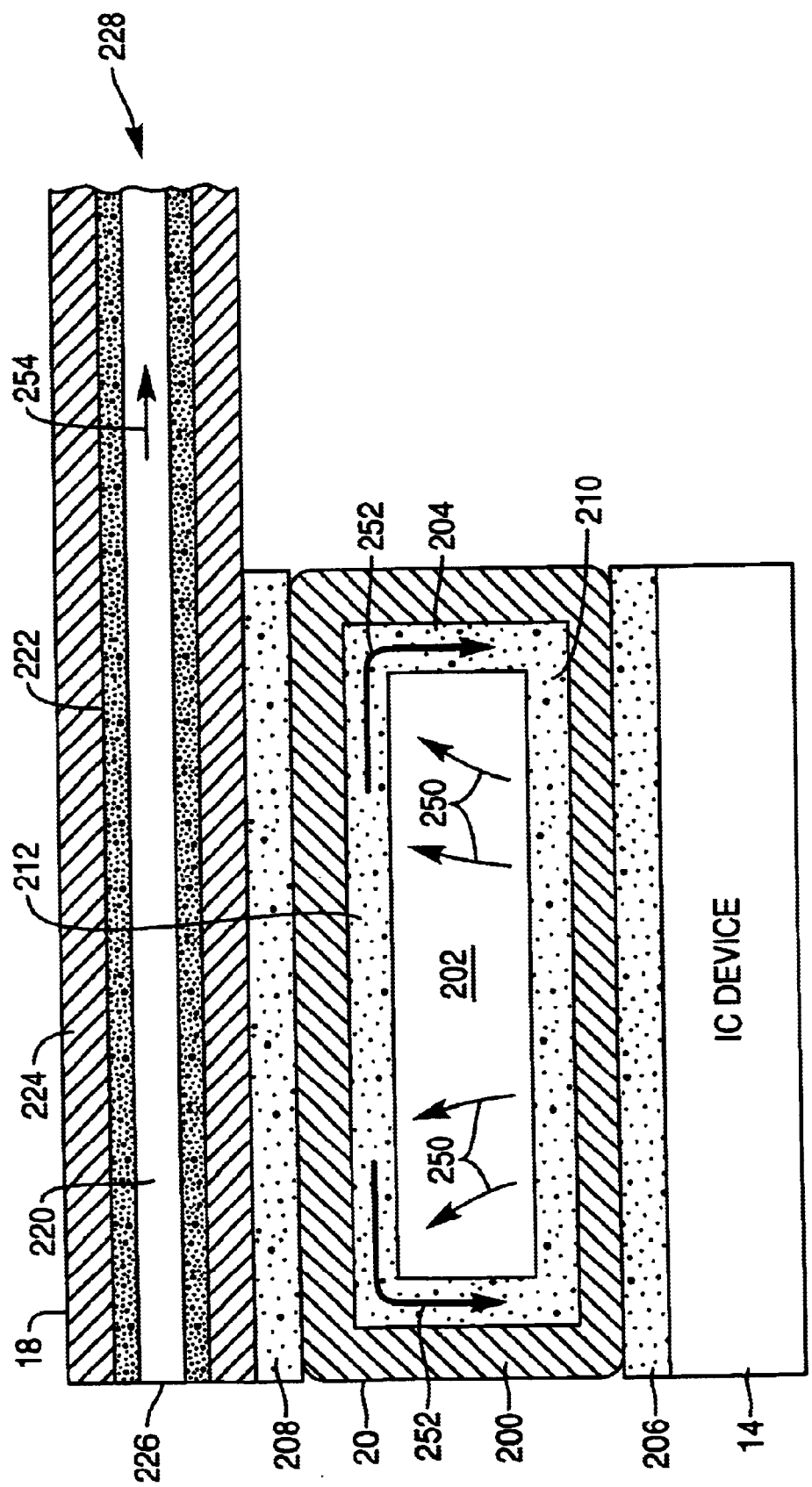
FIG. 3 is a cross-sectional view of a portion of a heat sink apparatus in accordance with one embodiment that is thermally contacted to a heat-generating device.

One embodiment of the heat spreader 20 is shown in FIG. 3. The heat spreader 20 includes a vapor chamber that has an outer metallic housing 200 that defines an inner space 202. A wick structure 204 lines the interior wall of the housing 200. The wick structure 204 defines paths through which cooled liquid can flow, and the inner space 202 allows heated vapor to flow between different parts of the chamber in response to liquid in the wick structure 204 being heated by heat generated from the device 14. The wick structure 204 is implemented with wire meshes, sintered powders, longitudinal grooves, screens, or any other structure defining paths for liquid flow.

Since the bottom surface of the heat spreader 20 is thermally contacted to the heat-generating device 14, the lower portion 210 of the wick structure 204 is heated by the device 14. Liquid in the wick structure lower portion 210 is heated and vaporized, with the vapor flowing from the wick structure 204 into space 202 generally along paths indicated by arrows 250.

The upper surface of the heat spreader 20 is thermally contacted to the heat pipe 18. Thus, heat is drawn away from an upper portion 212 of the wick structure 204. Thus as the vapor flows to the wick structure upper portion 212, the vapor is cooled. The cooled vapor changes phase back to liquid in the wick structure 204, with the cooled liquid returning along paths 252 to the lower portion 210 of the wick structure 204.

The environment within the vapor chamber of the heat spreader 20 is set by an equilibrium of liquid and vapor. When the evaporating end (the end thermally contacted to the device 14) of the vapor chamber is heated during operation, a pressure gradient is created between the evaporating end and the condensing end (the end thermally contacted to the heat-dissipating heat pipe 18). This pressure gradient is what causes the vapor generated by heating at the evaporating end to flow to the condensing end.

The heat pipe 18 has a housing 224 that defines a sealed inner chamber that includes a longitudinal bore 220 and a wick structure 222 lining the inner wall of the housing 224. The heat pipe 18 has an evaporating end 226 (the end proximate the portion of the heat pipe 18 that is thermally contacted to the heat spreader 20) and a condensing end 228 (the end proximate the portion of the heat pipe 18 that is thermally contacted to the remote heat sink 22).

As further shown in FIG. 3, an interface layer 206 formed of a heat conductive material is provided to thermally contact the heat spreader 20 to the device 14. In addition, the heat pipe 18 is also thermally contacted to the heat spreader 20 through an interface layer 208 formed of a thermally conductive material.

The thermal conductivity of the interface layer 208 is generally orders of magnitude lower than typical metallic materials such as copper, which is in turn orders of magnitude lower than the effective thermal conductivity of the heat pipe 18. As a result, the overall heat transfer efficiency from the device surface 14 to the heat sink 22 is determined and impeded by the solid materials used in the heat pipe 18 and heat spreader 20, the heat pipe 18 and heat spreader 20, and even more by the interface layer 208.

Liquid in the wick structure 222 (proximate the evaporating end 226) heated by the heat spreader 20 changes phase to vapor, with the vapor flowing through the bore 220 (indicated by arrow 254) to the condensing end 228. Cooled vapor at the condensing end changes phase to liquid and returns through the wick structure 222 to the evaporating end.

Figure 4:
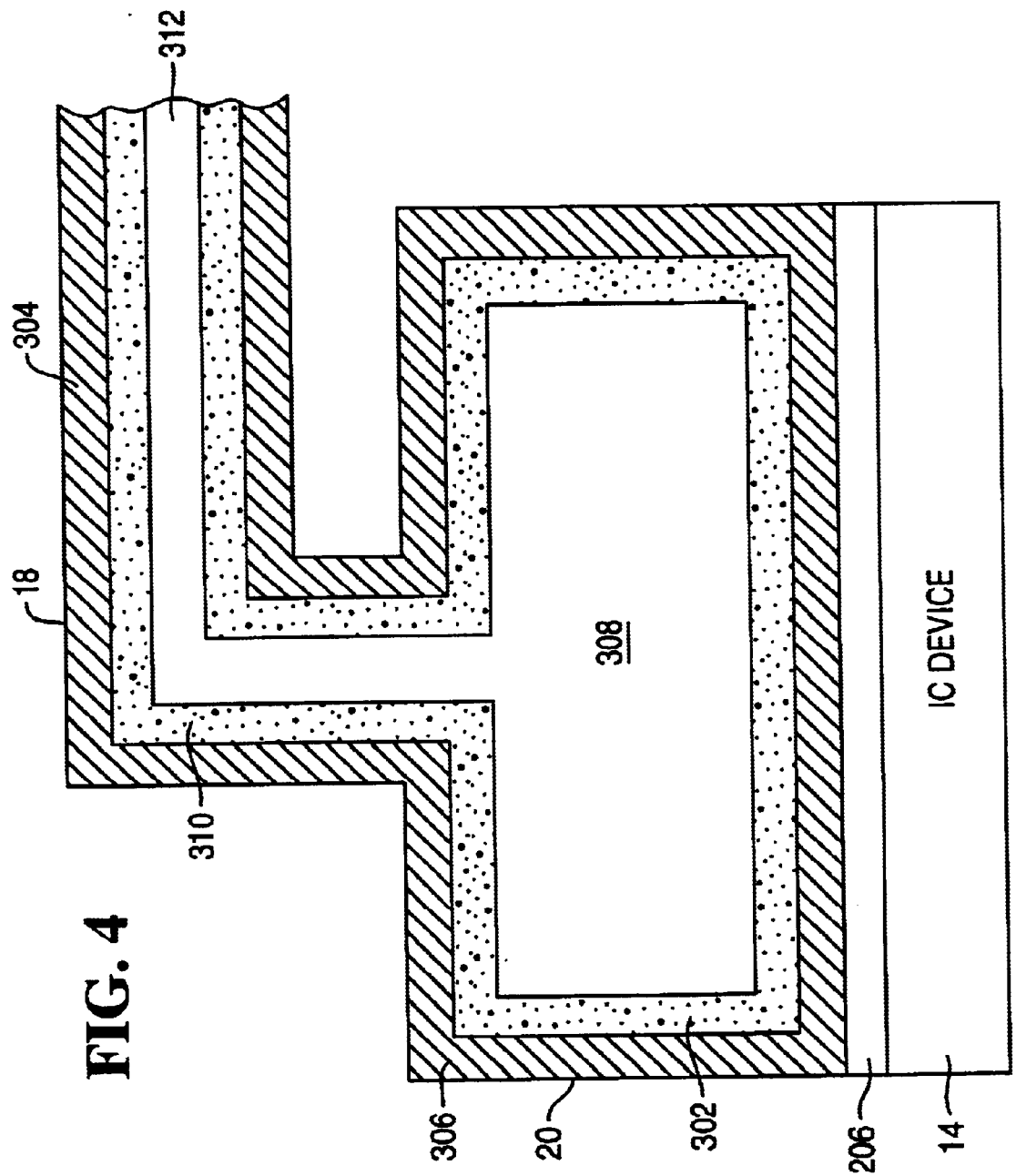
FIG. 4 is a cross-sectional view of a portion of heat sink apparatus in accordance with another embodiment that is thermally contacted to a heat-generating device.

FIG. 4 shows an alternative embodiment of a heat dissipation assembly, in which the heat pipe 18 is integrally formed with the heat spreader 20. The integration of the heat pipe 18 and the vapor chamber allows even more efficient transfer of heat since heat does not need to be transferred through the wails of the vapor chamber and heat pipe and through an interface material between the heat pipe and vapor chamber. As shown in FIG. 4, the housing 304 of the heat pipe 18 and the housing 306 of the vapor chamber 20 are integrally formed or otherwise attached such that a space 308 within the vapor chamber 20 is in fluid communication with an inner bore 312 of the heat pipe 18. Also, a wick structure 302 within the vapor chamber 20 is also integrally formed or otherwise attached to a wick structure 310 of the heat pipe 18.

The housing 304 of the heat pipe can be welded, bonded, or attached by other means to the housing 306 of the heat spreader vapor chamber. Alternatively, the housing 304 and housing 306 can be formed from a single sheet of metal. By integrating the heat pipe 18 and the heat spreader vapor chamber according to the FIG. 4 embodiment, an integrated phase-charge mechanism is provided.

In this arrangement, the evaporating end is proximate the surface of the heat spreader that is in thermal contact with the device 14, and the condensing end is the end of the heat pipe 18 in thermal contact with the remote heat sink 22. The environment defined by the heat pipe 18 and heat spreader vapor chamber is set by an equilibrium of liquid and vapor, with a pressure gradient created in response to the heat spreader surface being heated. Evaporated vapor flows through the inner space 308 of the heat spreader 20 into the longitudinal bore 312 of the heat pipe 18. The vapor is condensed into liquid and returned through the wick structures 310 and 302 to the evaporating end.

An efficient heat dissipation mechanism has been described to more efficiently transfer heat from a heat-generating device through a heat spreader to a heat conduit. The heat spreader is designed to have a thermal conductivity that is on the same order of magnitude as the heat conduit so that less thermal resistance is introduced in the thermal path between the heat-producing device and the heat conduit.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system comprising:
   a device that generates heat during operation the device having a surface;
   a heat spreader thermally contacted to the surface, the heat spreader having a phase-change mechanism adapted to spread heat; and
   a heat conduit in thermal communication with the heat spreader to transfer heat from the heat spreader to another location in the system,
   wherein the heat spreader has a first housing, and the heat conduit has a second housing, each of the first and second housings defining an inner space in the corresponding heat spreader or heat conduit,
   the housings being connected to provide fluid communication between the inner spaces of the heat spreader and heat conduit,
   wherein the heat spreader has a first wick structure with fluid flow paths for liquid flow, and the heat conduit has a second wick structure with fluid flow paths for liquid flow,
   wherein the first and second wick structures are connected so that the fluid flow paths of the first wick structure are in communication with the fluid flow paths of the second wick structure.

2. The system of claim 1, wherein the heat conduit is adapted to transfer heat using a phase-change mechanism.

3. The system of claim 2, wherein the heat conduit comprises a heat pipe.

4. The system of claim 2, wherein the phase-change mechanism of the heat spreader is adapted to transfer heated vapor and cooled liquid within the heat spreader.

5. The system of claim 4, wherein the phase-change mechanism of the heat conduit is adapted to transfer heated vapor and cooled liquid within the heat conduit.

6. The system of claim 5, wherein the heat spreader and heat conduit are in fluid communication with each other to enable heated vapor to flow from the heat spreader into the heat conduit and to enable cooled liquid to flow from the heat conduit back into the heat spreader.

7. The system of claim 6, wherein the heat conduit includes a vapor flow channel.

8. The system of claim 7, wherein the heat spreader includes a vapor chamber.

9. The system of claim 1, wherein an outer surface of the heat conduit is thermally contacted to an outer surface of the heat spreader.

10. The system of claim 1, further comprising a chassis containing the device, heat spreader, and heat conduit.

11. The system of claim 10, further comprising an airflow generator.

12. The system of claim 1, further comprising:
    a second device that generates heat during operation;

a second heat spreader thermally contacted to the second device, the second heat spreader having a phase-change mechanism adapted to spread heat; and a second heat conduit in thermal communication with the second heat spreader to transfer heat from the second heat spreader to another location in the system, wherein the second heat spreader has a third wick structure, and the second heat conduit has a fourth wick structure, the third wick structure connected to the fourth wick structure to enable fluid communication between the third and fourth wick structures.

13. A heat dissipation apparatus, comprising:

a heat pipe having a first housing and a vapor flow channel; and a heat spreader structured to be thermally contacted to a heat-generating device, the heat spreader having a second housing and a chamber, the first and second housings being connected so that the chamber of the heat spreader is in fluid communication with the vapor flow channel of the heat pine, wherein the heat pipe has a first wick structure with a liquid flow path, and the heat spreader has a second wick structure with a liquid flow path, the first and second wick structures being connected so that the liquid flow paths are in fluid communication.

14. The apparatus of claim 13, wherein the vapor flow channel of the heat pipe is adapted to receive heated vapor flow from the chamber of the heat spreader.

15. The apparatus of claim 14, wherein the second wick structure of the heat spreader is adapted to receive liquid flow from the first wick structure of the heat pipe to return cooled liquid to the heat spreader.

16. The apparatus of claim 13, wherein the heat pipe has a first end portion and a second end portion, the first end portion proximate the heat spreader, the apparatus further including a heat sink, wherein the second end portion of the heat pipe is proximate the heat sink.

17. The apparatus of claim 16, further comprising an airflow generator to direct air flow to the heat sink.

18. A heat dissipation apparatus, comprising:

a heat sink;

an elongated heat conduit having a first end portion and a second end portion, the second end portion proximate and in thermal contact with the heat sink; and a heat spreader adapted to thermally contact a heat-generating device, the first end portion of the elongated heat conduit proximate and in thermal contact with the heat spreader, wherein the heat spreader has a vapor chamber to receive heated vapor flow, wherein the heat spreader has a first wick structure, and the elongated heat conduit has a second wick structure, the first wick structure connected to the second wick structure to enable liquid communication between the first and second wick structures.

19. The apparatus of claim 18, wherein the elongated heat conduit has a vapor flow channel, the vapor flow channel adapted to be in fluid communication with the vapor chamber of the heat spreader.

20. The apparatus of claim 18, wherein the elongated heat conduit comprises a heat pipe.

21. The heat dissipation apparatus of claim 13, further comprising:

a second heat pipe having a vapor flow channel; and a second heat spreader structured to be thermally contacted to a second heat-generating device, the second heat spreader having a second chamber, the second heat spreader and the second heat pipe being connected so that the second chamber of the second heat spreader is in fluid communication with the vapor flow channel of the second heat pipe, wherein the second heat pipe has a third wick structure with a liquid flow path, and the second heat spreader has a fourth wick structure with a liquid flow path, the third and fourth wick structures being connected so that the liquid flow paths of the third and fourth wick structures are in fluid communication.

* * * * *